United States Patent
Zhang

(10) Patent No.: US 7,158,220 B2
(45) Date of Patent: Jan. 2, 2007

(54) THREE-DIMENSIONAL MEMORY SYSTEM-ON-A-CHIP

(76) Inventor: Guobiao Zhang, P.O. Box 6182, Stateline, NV (US) 89449-6182

( * ) Notice: Subject to any disclaimer, the term of this patent is extended or adjusted under 35 U.S.C. 154(b) by 92 days.

(21) Appl. No.: 10/967,893

(22) Filed: Oct. 19, 2004

(65) Prior Publication Data

US 2006/0081883 A1    Apr. 20, 2006

(51) Int. Cl.
*G11C 5/02* (2006.01)
*H01L 27/10* (2006.01)
(52) U.S. Cl. .................... 356/51; 365/63; 257/211
(58) Field of Classification Search ............. 365/51, 365/63; 257/211
See application file for complete search history.

(56) References Cited

U.S. PATENT DOCUMENTS

| | | | |
|---|---|---|---|
| 5,835,396 A | 11/1998 | Zhang | 365/51 |
| 6,034,882 A | 3/2000 | Johnson et al. | 365/103 |
| 6,385,074 B1 | 5/2002 | Johnson et al. | 365/103 |
| 6,717,222 B1 | 4/2004 | Zhang | 257/390 |
| 6,864,585 B1* | 3/2005 | Enquist | 257/777 |
| 6,948,105 B1* | 9/2005 | Rajsuman | 714/724 |
| 2006/0097279 A1* | 5/2006 | Zhang | 257/120 |

* cited by examiner

*Primary Examiner*—Evan Pert

(57) ABSTRACT

The present invention provides a three-dimensional memory (3D-M) system-on-a-chip (SoC). It takes full advantage of the difference in the number of interconnect levels between the embedded processor (eP) and embedded memory (eM) in an SoC chip. The un-used interconnect space on top of the eM block is converted into 3D-M. This conversion incurs minimum additional cost, but with significant benefits: 3D-M can add a large storage capacity to the SoC chip and therefore the chip becomes more powerful.

10 Claims, 9 Drawing Sheets

THREE-DIMENSIONAL MEMORY SYSTEM-ON-A-CHIP

This patent application relates to a provisional patent application, "3D-Memory System-on-a-chip", provisional patent No. 60/511,420, filed on Oct. 14, 2003.

BACKGROUND

1. Technical Field of the Invention

The present invention relates to the field of integrated circuits, and more particularly to three-dimensional memory system-on-a-chip (3DM-SoC).

2. Related Arts

The latest advancement of integrated circuits enables the placement of more and more functions on a single chip, thus resulting in wide adoption of system-on-a-chip (SoC). As illustrated in FIG. 1A, an SoC chip 0SOC typically comprises at least one embedded memory (eM) block 0EM and at least one embedded processor (eP) block 0EP. The eM block 0EM provides data storage functions while the eP block 0EP processes the internal and/or external data. The eM block 0EM comprises RAM and/or ROM; the eP block 0EP could comprise logic and/or analog functional blocks.

Because the basic building blocks of prior-art embedded memory and embedded processor are both substrate-based transistors, the eM and eP blocks can be easily integrated on a same substrate. However, it should be noted that the eM block 0EM requires much fewer number of interconnect levels than the eP block 0EP. For example; in the SoC chip illustrated in FIG. 1B, the eP block 0EP uses four levels of interconnect 1EP-IL1, IL2, IL3 IL4, while the eM block 0EM only uses two levels of interconnect 1EM-IL1, IL2. For damascene-based process, within the eM region, the interconnect space 1DY are filled with dummy metals (such as 30d, 40d) and therefore, wasted.

On a state-of-the-art SoC, more than ~50% of the chip area can be embedded memory. Moreover, the number of the interconnect levels 1EM in the eM region 0EM and the number of the interconnect levels 1EP in the eP region 0EP are quite different (~3 vs.>~8). Accordingly, a large interconnect space 1DY is wasted (>~5 interconnect levels in >~50% of chip area). To fully utilize this wasted interconnect space 1DY, the present invention provides a three-dimensional memory (3D-M) system-on-a-chip (3DM-SoC). It takes advantage of the fact that 3D-M can be stacked on top of the substrate circuit and does not occupy substrate real estate. Instead of dummy metals, the present invention uses 3D-M to fill in the interconnect space IDY. This 3D-M provides a large storage capacity and is an ideal supplement to the substrate-based embedded memory. As a result, the 3DM-SoC will become more powerful.

OBJECTS AND ADVANTAGES

It is a principle object of the present invention to provide a system-on-a-chip with more functionality.

It is a further object of the present invention to provide a system-on-a-chip with minimum added manufacturing cost.

It is a further object of the present invention to provide a three-dimensional memory whose structure and processing steps are compatible with the conventional interconnects.

In accordance with these and other objects of the present invention, a three-dimensional memory system-on-a-chip (3DM-SoC) is disclosed.

SUMMARY OF THE INVENTION

The present invention provides a three-dimensional memory system-on-a-chip (3DM-SoC). It takes full advantage of the difference in the number of interconnect levels between the embedded processor (eP) and embedded memory (eM) in an SoC chip. The un-used interconnect space on top of the eM block is converted into 3D-M. This conversion incurs minimum additional cost (for certain preferred embodiments, only one additional masking step is needed for each 3D-M level), but with significant benefits: 3D-M can add a large storage capacity to the SoC chip and therefore the chip becomes more powerful.

DETAILED DESCRIPTION OF THE PREFERRED EMBODIMENT

Figure 2:
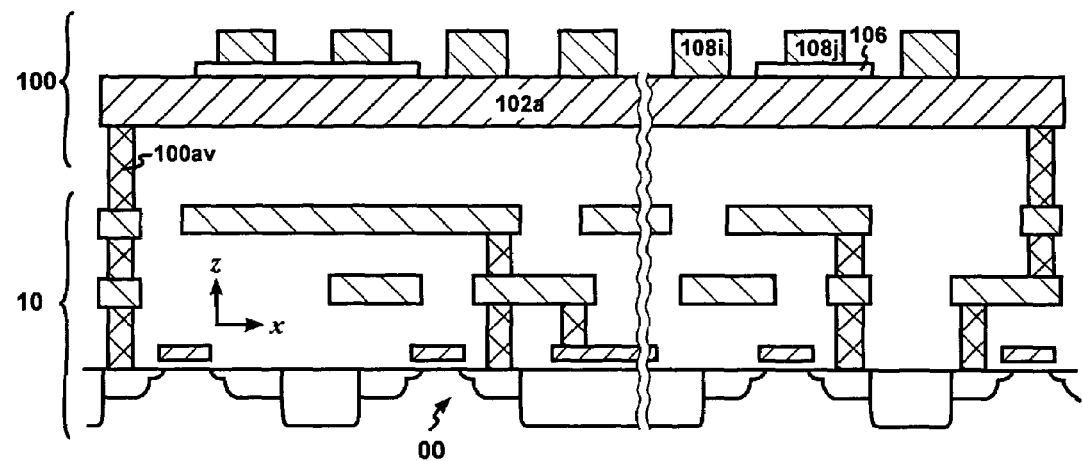
FIG. 2 is a cross-sectional view of a preferred three-dimensional memory (3D-M).

In a three-dimensional memory (3D-M), one or more 3D-M levels are stacked one above another. 3D-M has been disclosed in U.S. Pat. Nos. 5,835,396, 6,717,222 and others. FIG. 2 illustrates a preferred 3D-M. In this preferred 3D-M, at least one physical memory level 100 of the 3D-M is stacked on a substrate circuit 10. On each memory level 100, there are a plurality of address-select lines, including word line 102a and bit line 108i, 108j. At each intersection of word and bit lines, there is a 3D-M cell. This preferred 3D-M is a mask-programmable 3D-M: depending on the existence or absence of an insulating layer 106, this 3D-M cell represents either logic "0" or "1". Contact vias (100av . . . ) provide electrical connection between address-select lines (102a . . . ) and the substrate circuit.

Depending on its programming means, the 3D-M can be categorized into electrically programmable 3D-M (EP-3DM) and non-electrically programmable 3D-M (NEP- 3DM). Examples of the EP-3DM include 3-D RAM (3D-RAM), 3-D write-once memory (a.k.a. 3-D one-time programmable, i.e. 3D-OTP), and 3-D write-many (3D-WM). A popular NEP-3DM is mask-programmable 3-D read-only memory (3D-MPROM). Details about these 3D-M's are disclosed in U.S. Pat. No. 6,717,222, "Three-Dimensional Memory", filed on Aug. 28, 2002, by the same inventor.

Figure 1A:
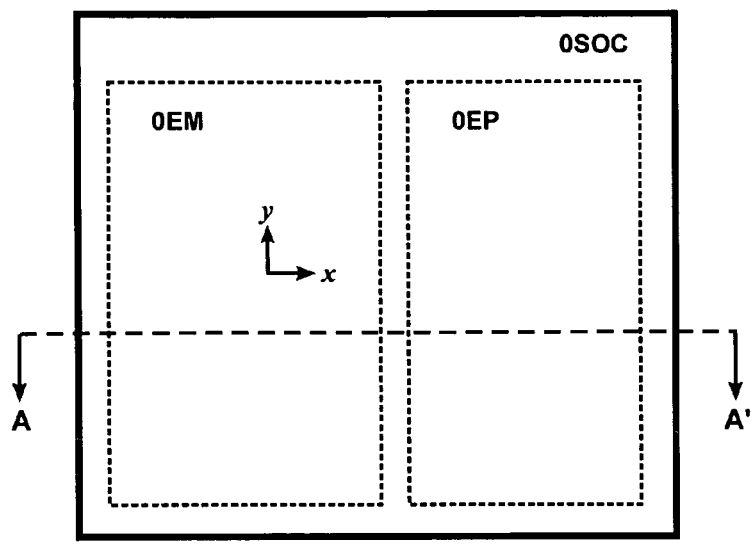
FIG. 1A is a layout of a prior-art system-on-a-chip (SoC)
Figure 1B:
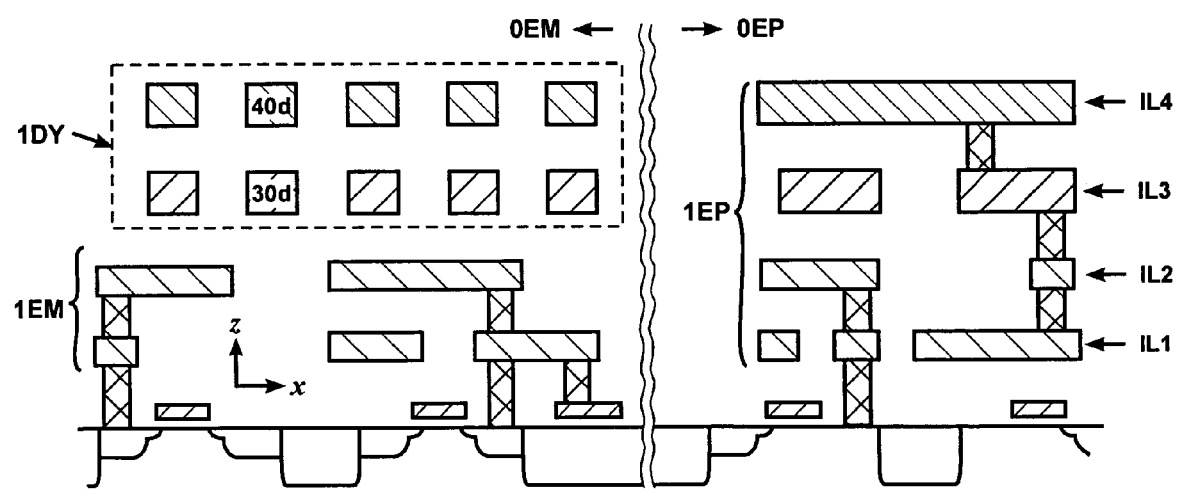
FIG. 1B is a cross-sectional view of the prior-art SoC chip of FIG. 1A along the cut-line AA'.
Figure 3:
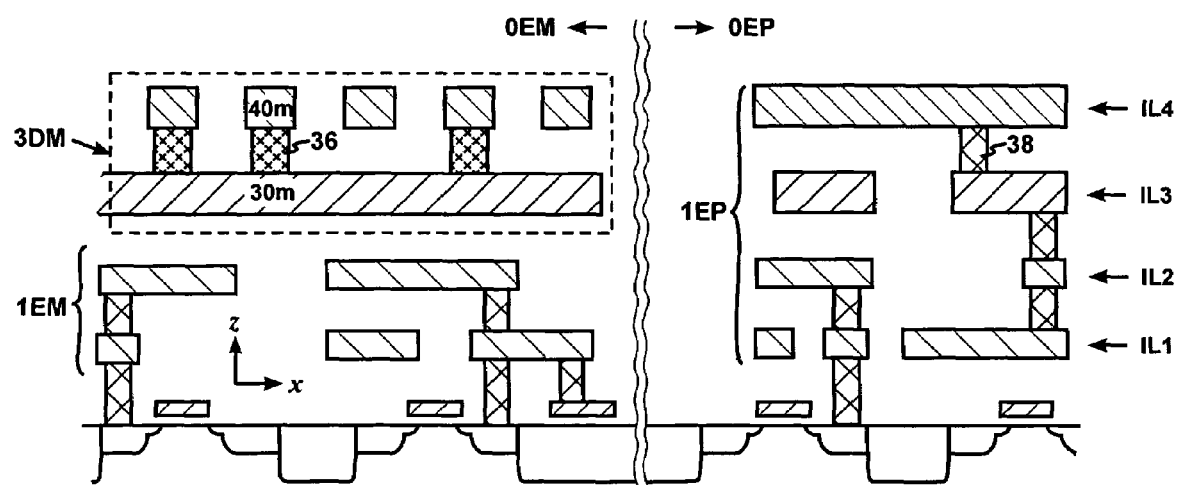
FIG. 3 is cross-sectional view of a preferred three-dimensional memory system-on-a-chip (3DM-SoC).

FIG. 3 illustrates a preferred three-dimensional memory system-on-a-chip (3DM-SoC). In this preferred embodiment, the interconnect space 3DM, which was occupied by dummy metals 30d, 40d in a prior-art SoC (FIG. 1B), is converted into a 3D-M level. Interconnect level IL3 becomes the bit line 30m and interconnect level IL4 become the word line 40m. Between word and bit lines, there is a 3D-M layer 36. The 3D-M layer 36 could comprise a diode layer (including p-n diode, p-i-n diode, Schottky diode and others), or an active device. Various preferred 3D-M layers are disclosed in U.S. Pat. Nos. 5,835,396, 6,717,222 and others.

In this preferred embodiment, the difference in the number of interconnect levels 1EP, 1EM between the eP and eM regions 0EP, 0EM is two (2). Accordingly, one 3D-M level could be built. If this difference is six, then up to five 3D-M levels could be built, if interleaved 3D-M structure is used; or three, if separate 3D-M structure is used (referring to FIGS. 9–10 of U.S. Pat. No. 6,717,222).

Figure 4:
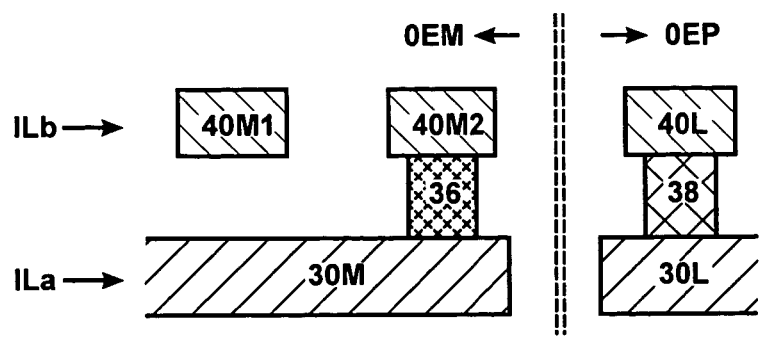
FIG. 4 illustrates a first preferred 3D-M/interconnect in a preferred 3DM-SoC.

FIG. 4 illustrates a first preferred 3D-M/interconnect in a preferred 3DM-SoC. Here, 3D-M/interconnect refers to two adjacent interconnect levels ILa (including lower conductors 30L, 30M), ILb (including upper conductors 40L, 40M1, 40M2) and their connecting means. In a 3D-M/interconnect, there are two types of connecting means between two interconnect levels ILa, ILb:

1) in the eP region 0EP, by a via 38 to form a conventional interconnect;
2) in the eM region 0EM, by a 3D-M layer 36 to form a 3D-M cell (the digital information stored in the 3D-M cell is represented by, e.g. the existence or absence of the 3D-M layer 36).

In comparison, in a conventional interconnect, there is only one type of connecting means between two interconnect levels.

Figure 5A:
FIGS. 5A–5E illustrate a preferred manufacturing process of the first preferred 3D-M/interconnect.
Figure 5B:
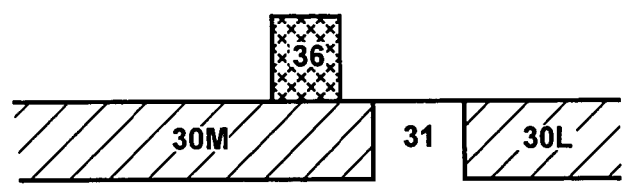
Figure 5C:
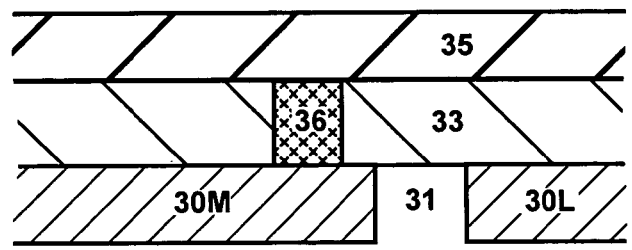
Figure 5D:
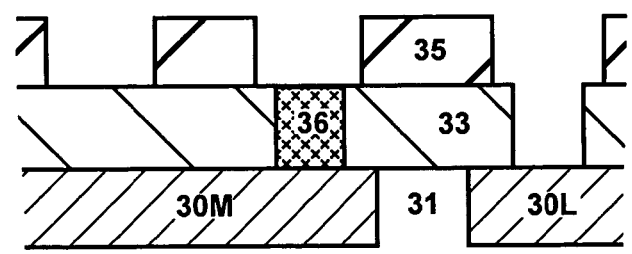
Figure 5E:
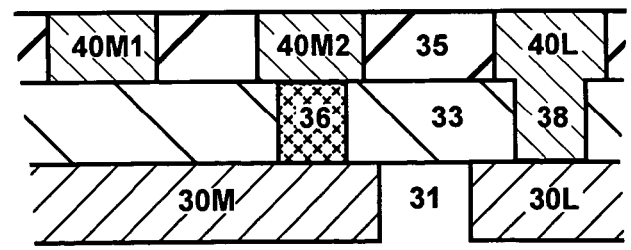

FIGS. 5A–5E illustrate a preferred manufacturing process of the first preferred 3D-M/interconnect. This manufacturing process is compatible with the conventional dual-damascene process, with only one additional masking step (i.e. the step illustrated in FIG. 5B). Accordingly, it incurs minimum additional cost to the SoC manufacturing. It comprises the following steps:

1) forming the first interconnect level ILa, through means such as damascene (FIG. 5A). Numeral 31 refers to the intra-level dielectric between lower conductors 30L, 30M;
2) depositing and etching the 3D-M layer. After this step, a plurality of 3D-M pillars 36 are formed at the location of logic "1" cells in the eM region 0EM (FIG. 5B);
3) depositing, planarizing and etching back a first inter-level dielectric 33 until the 3D-M pillars 36 are exposed in the eM region 0EM. This is followed by the deposition of a second inter-level dielectric 35 (FIG. 5C). The structure and composition of these two inter-level dielectrics 33, 35 are similar to those used in the conventional dual-damascene process;
4) etching the via pattern and trench patterns until the top surfaces of the 3D-M pillars 36 are exposed in the eM region 0EM and the top surfaces of the lower conductor 30L are exposed in the eP region 0EP (FIG. 5D). This step is also similar to the conventional dual-damascene process;
5) filling in and planarizing the second interconnect level ILb, through means such as CMP (FIG. 5E). This step is same as the conventional dual-damascene process.

Figure 6:
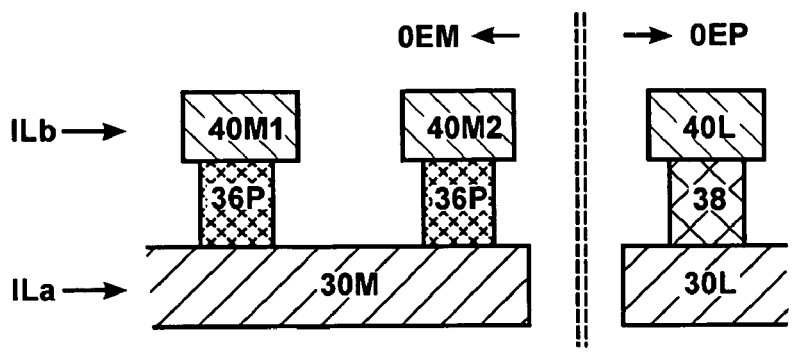
FIG. 6 illustrates a preferred electrically-programmable 3D-M level in another preferred 3DM-SoC.

FIG. 6 is a preferred electrically-programmable 3D-M (EP-3DM) level in another preferred 3DM-SoC. In this EP-3DM, instead of selectively having 3D-M layer at the memory cell location (as is illustrated in FIG. 4), there is a 3D-M layer 36P at every memory cell location. This 3D-M layer 36P could comprise an antifuse-diode combo, or other active devices. Details of the EP-3DM are disclosed in U.S. Pat. Nos. 5,835,396, 6,717,222 and others.

Figure 7A:
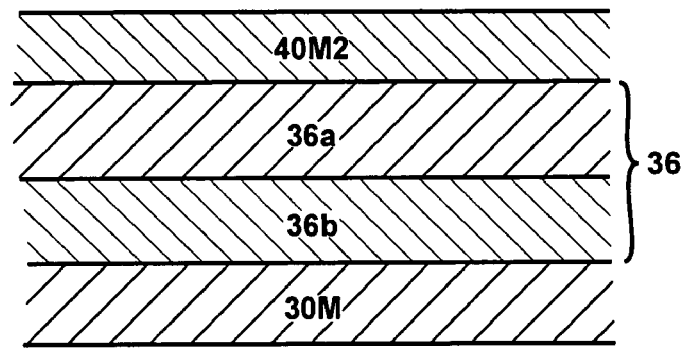
FIGS. 7A–7C illustrates several preferred 3D-M layers.
Figure 7B:
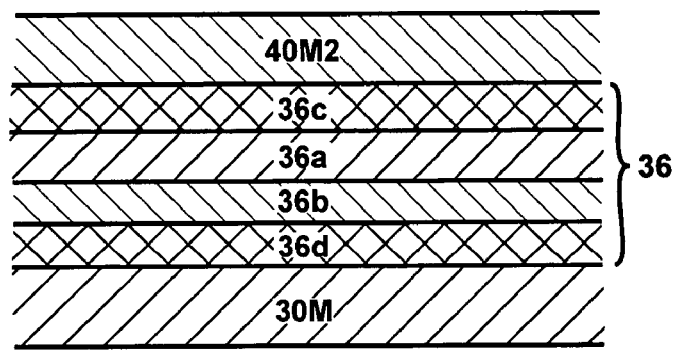
Figure 7C:
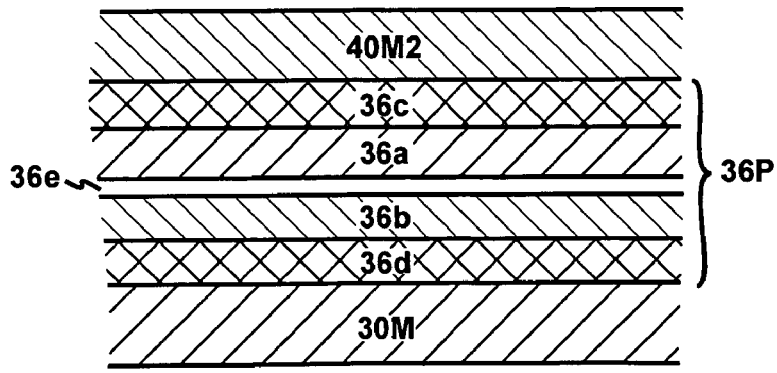

FIGS. 7A–7C illustrates several preferred 3D-M layers. The preferred 3D-M layer 36 of FIG. 7A comprises a p-layer 36a and an n-layer 36b. It could further comprise an i-layer between the p- and n-layers 36a, 36b. This i-layer could be lightly-doped. The preferred 3D-M layer 36 of FIG. 7B further comprises a bottom buffer layer 36d and a top buffer layer 36c. These buffer layers 36c, 36d comprise conductive materials, e.g. TiW, W, Cu, or heavily-doped semiconductor materials. They can be laid down at the same time with the p- and n-layers 36a, 36b. The bottom buffer layer 36d can prevent the damage on the lower conductor 30M from causing defects to the n-layer 36b, and the top buffer layer 36c can protect the p-layer 36a during the etch-back of the first inter-level dielectric 33. The preferred 3D-M layer 36P further comprises an antifuse layer 36e (FIG. 7C). This 3D-M layer can be used in electrically-programmable 3D-M (EP-3DM). To those skilled in the art, the above disclosed 3D-M layers just represents a small number of possible 3D-M layers. Other preferred 3D-M layers are disclosed in U.S. Pat. Nos. 5,835,396, 6,717,222 and others.

Figure 8:
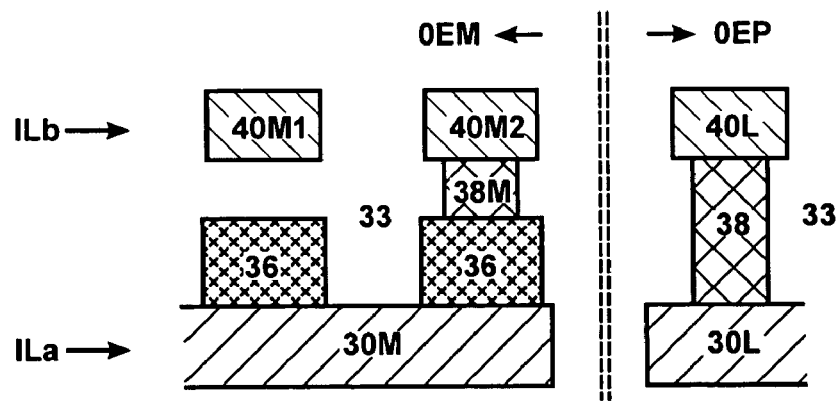
FIG. 8 illustrates a second preferred 3D-M/interconnect in yet another preferred 3DM-SoC.

FIG. 8 is a second preferred 3D-M/interconnect in yet another preferred 3DM-SoC. Similar to FIG. 4, this preferred 3D-M/interconnect is also compatible to dual-damascene process and incurs minimum additional cost to manufacturing. The only difference is that, instead of directly contacting the 3D-M layer 36, the upper conductor 40M2 contacts the 3D-M layer 36 through a half-via 38M in the eM region 0EM. Here, half-via 38M only extends half-way through the inter-level dielectric 33 (i.e. from the upper conductor 40M2 to the top of the 3D-M layer 36), not like the full via 38, which extends fully through the inter-level dielectric 33 (i.e. from the upper conductor 40L to the lower conductor 30L).

Figure 9A:
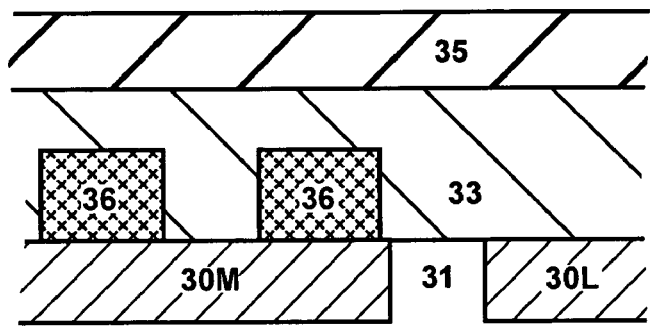
FIGS. 9A–9C illustrate a preferred manufacturing process of the second preferred 3D-M/interconnect.
Figure 9B:
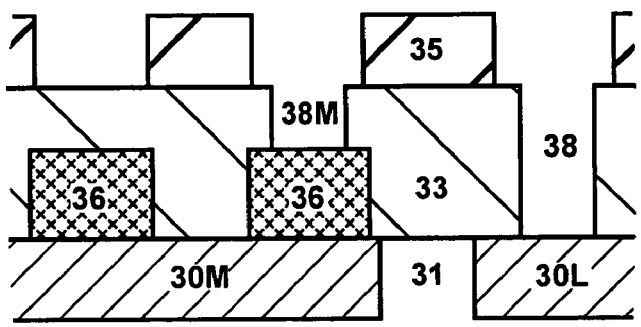
Figure 9C:
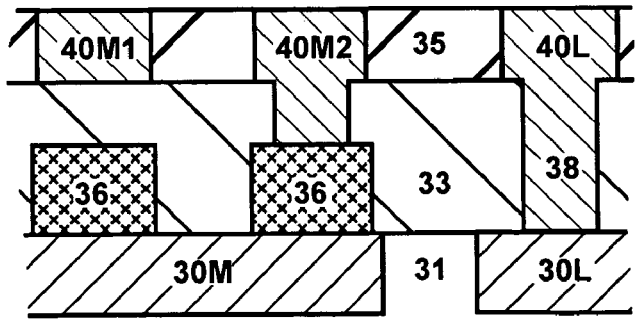

FIGS. 9A–9C illustrate a preferred manufacturing process of the second preferred 3D-M/interconnect. Similar to the manufacturing process illustrated in FIGS. 5A–5E, a plurality of 3D-M pillars 36 are formed in the eM region 0EM (FIG. 9A). For this preferred embodiment, a 3D-M pillar 36 remains at the location of every 3D-M cell. Then the first and second inter-level dielectrics 33, 35 are deposited and planarized. Different from that of FIG. 5C, no 3D-M pillar 36 is exposed in the eM region 0EM during this step. The steps in FIGS. 9B–9C are similar to those in FIGS. 5D–5E, i.e. forming via and trench and filling them with upper conductor. Here, via 38M (i.e. via in the eM region 0EM) is referred to as a half-via, because its depth is shorter than the full via 38 (i.e. the via in the eP region 0EP). The digital information stored in the 3D-M is represented by the existence or absence of the half-via 38M.

Figure 10:
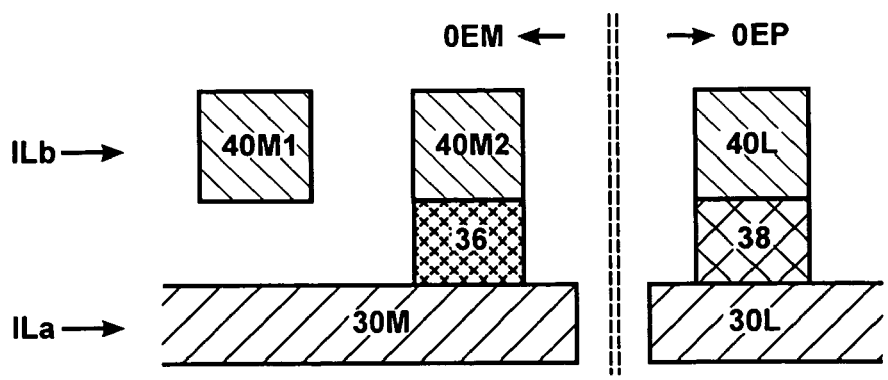
FIG. 10 illustrates a third preferred 3D-M/interconnect in yet another preferred 3DM-SoC.

FIG. 10 is a third preferred 3D-M/interconnect in yet another preferred 3DM-SoC. The 3D-M in this preferred 3D-M/interconnect is a self-aligned pillar-shaped 3D-M.

Details about this type of the 3D-M are disclosed in the U.S. Pat. No. 6,717,222 and others. For the self-aligned pillar-shaped 3D-M, one dimension of the 3D-M layer 36 is equal to the width of the lower conductor 30M; and the other dimension of the 3D-M layer 36 is equal to the width of the upper conductor 40M2.

Figure 11A:
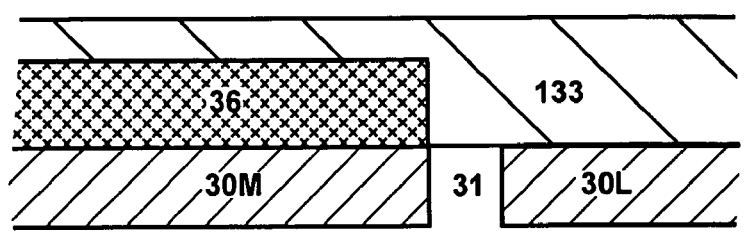
FIGS. 11A–11D illustrate a preferred manufacturing process of the third preferred 3D-M/interconnect.
Figure 11B:
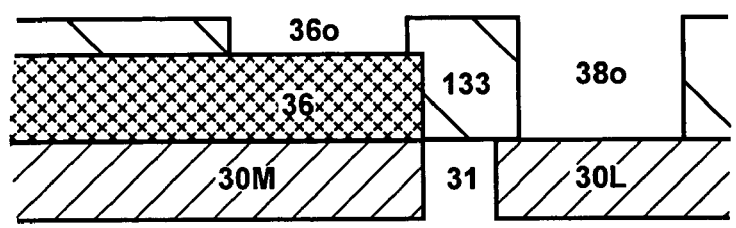
Figure 11C:
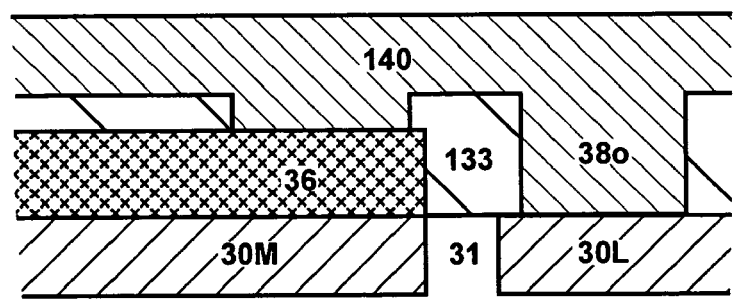
Figure 11D:
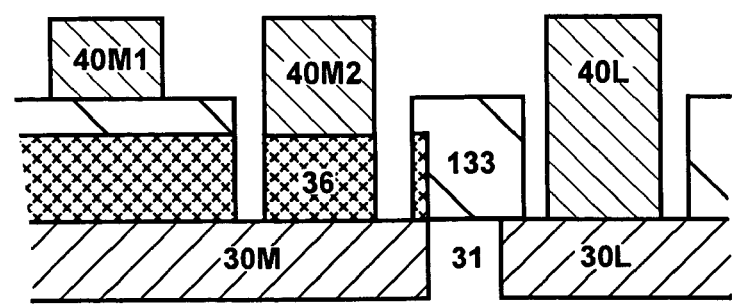

FIGS. 11A–11D illustrate a preferred manufacturing process of the third preferred 3D-M/interconnect. It comprises the following steps:

1) deposit the lower conductors 30M, 30L and the 3D-M layer 36 sequentially. Then remove the 3D-M layer 36 in the eP region 0EP. After that, etch the 3D-M layer 36 and the lower conductors 30M at the same time in the eM region 0EM. This is followed by the deposition and planarization of a dielectric layer 133 (FIG. 11A);

2) etch openings 36o in the eM region 0EM and 38o in the eP region 0EP (FIG. 11B). In this preferred embodiment, these openings are nF-opening. Details about nF-opening are disclosed in U.S. patent application Ser. Nos. 10/230,648, 10/230,610 and others;

3) form the upper conductor 140 (FIG. 11C);

4) pattern and etch the upper conductor 140. This step will etch through the 3D-M layer 36 until the lower conductor 30M is exposed (FIG. 11D).

Figure 12:
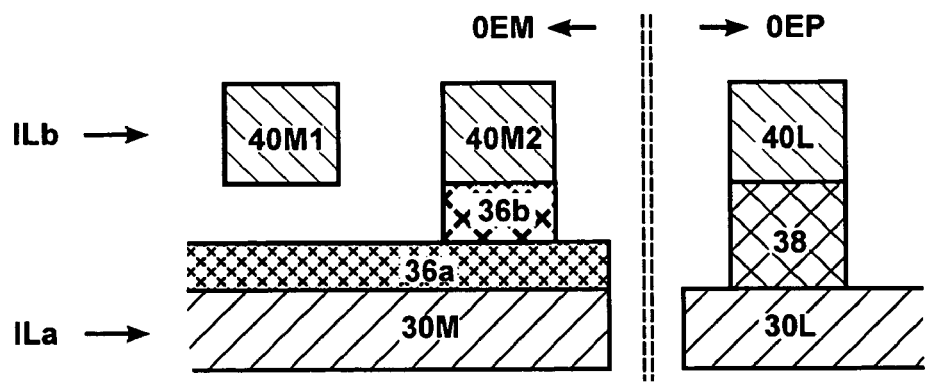
FIG. 12 illustrates a fourth preferred 3D-M/interconnect in yet another preferred 3DM-SoC.

FIG. 12 is a fourth preferred 3D-M/interconnect in yet another preferred 3DM-SoC. The 3D-M in this preferred 3D-M/interconnect is a self-aligned natural-junction 3D-M. Details about this type of the 3D-M are disclosed in the U.S. Pat. No. 6,717,222 and others. The 3D-M layer 36b is naturally formed at the intersection of the upper conductor 40M2 and the lower conductor 30M.

Figure 13A:
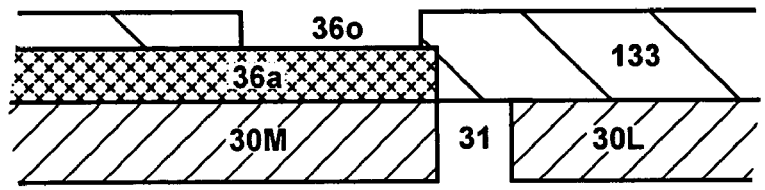
FIGS. 13A–13D illustrate a preferred manufacturing process of the fourth preferred 3D-M/interconnect.
Figure 13B:
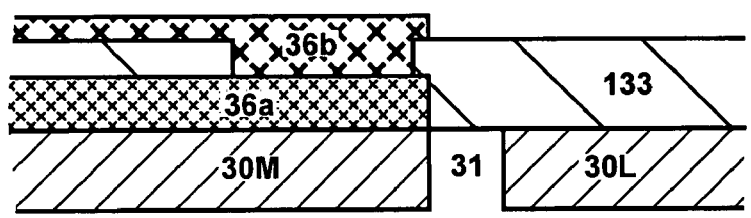
Figure 13C:
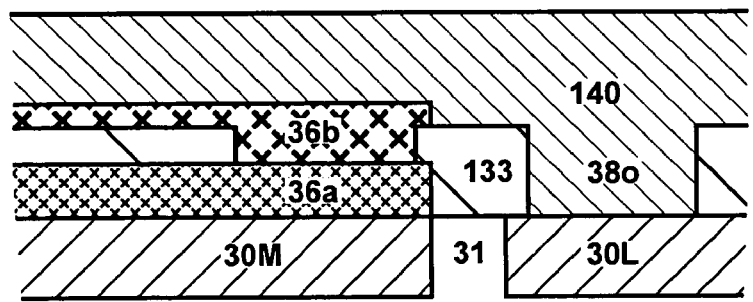
Figure 13D:
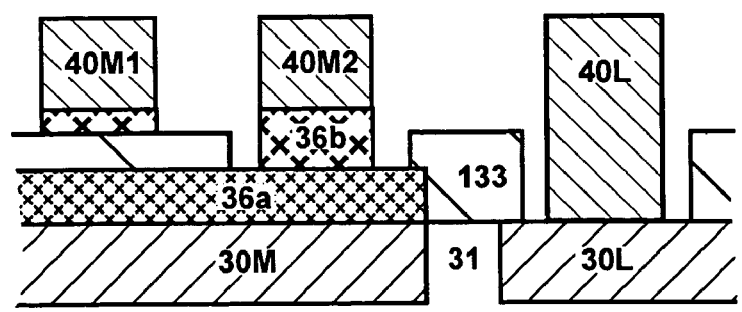

FIGS. 13A–13D illustrate a preferred manufacturing process of the fourth preferred 3D-M/interconnect. It comprises the following steps:

1) deposit the lower conductors 30M, 30L and the first half 3D-M layer 36a. This half 3D-M layer 36a could be the n-layer of the 3D-M layer 36 (FIG. 7A). Then remove the half 3D-M layer 36a in the eP region 0EP. After that, etch the half 3D-M layer 36a and the lower conductors at the same time in the eM region 0EM. This is followed by deposition and planarization of a dielectric layer 133 before forming nF-openings 36o in the eM region 0EM (FIG. 13A);

2) form the second half 3D-M layer 36b and remove said layer in the eM region 0EM (FIG. 13B);

3) etch nF-openings 38o in the eP region 0EP and deposit the upper conductor 140 (FIG. 13C);

4) pattern and etch the upper conductor 140. This step is similar to that in FIG. 11D (FIG. 13D).

Figure 14A:
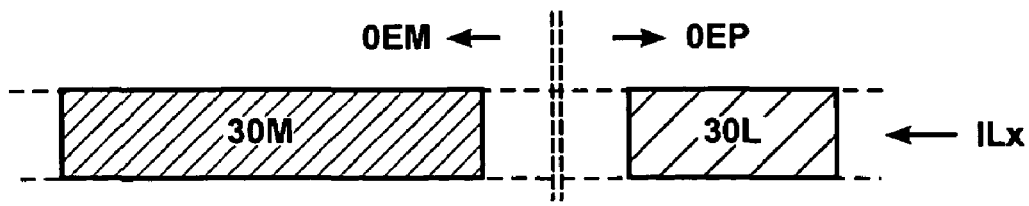
FIGS. 14A–14CB illustrates a preferred hybrid interconnect level and two preferred manufacturing processes.

FIG. 14A illustrates a preferred hybrid interconnect level ILx. In a hybrid interconnect level ILx, different conductors are used in different regions, even though they are located at the same physical level. The purpose of using different conductors in different regions is to meet different requirements on conductors in these regions. For the preferred embodiment of FIG. 14A, in the eM region 0M, the eM conductor 30M comprises $TiSi_2$ or other conductive materials, which is suitable for the 3D-M; in the eP region 0EP, the eP conductor 30L comprises Cu, which is suitable for the conventional interconnect.

Figure 14B:
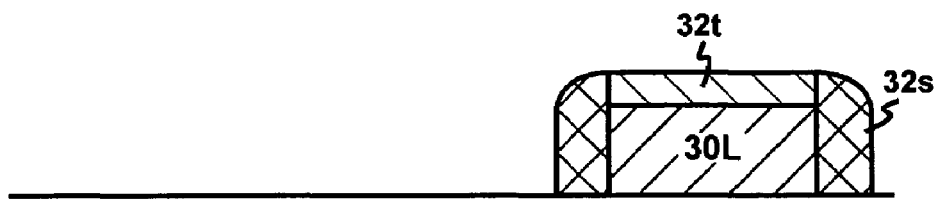
Figure 14B:
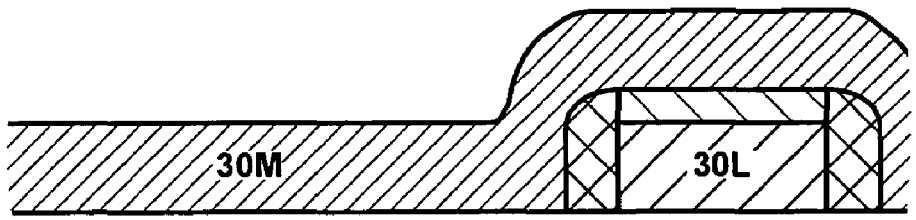

FIGS. 14BA–14BB illustrate a first preferred manufacturing process for the hybrid interconnect level ILx. The eP conductor 30L is formed first, together with a covering dielectric layer 32t. Then a spacer layer 32s is formed at its both edges (FIG. 14BA). This is followed by the deposition of the eM conductor 30M (FIG. 14BB). After patterning the eM conductor 30M, the preferred hybrid interconnect level ILx is formed.

Figure 14C:
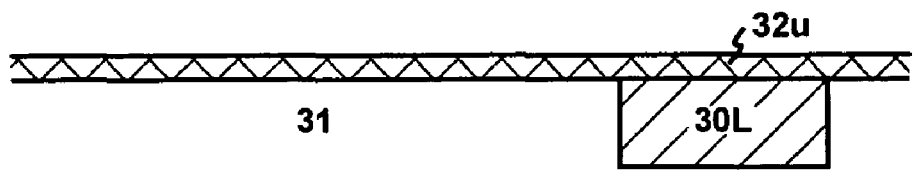
Figure 14C:
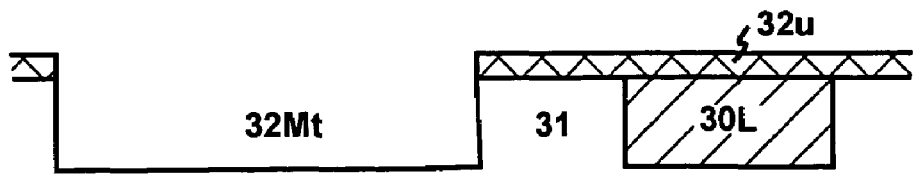

FIGS. 14CA–14CB illustrate a second preferred manufacturing process for the hybrid interconnect level ILx. This process flow is compatible with damascene process. The eP conductor 30L is formed in a first dielectric 31 by damascene first. Then the whole wafer surface is covered with a protective dielectric 32u (FIG. 14CA). After that, a trench 32Mt is formed in the first dielectric 31 by etching through the protective dielectric 32u (FIG. 14CB). After filling the trench 32Mt with the eM conductor 30M and the planarization step, the preferred hybrid interconnect level ILx is formed.

Figure 15:
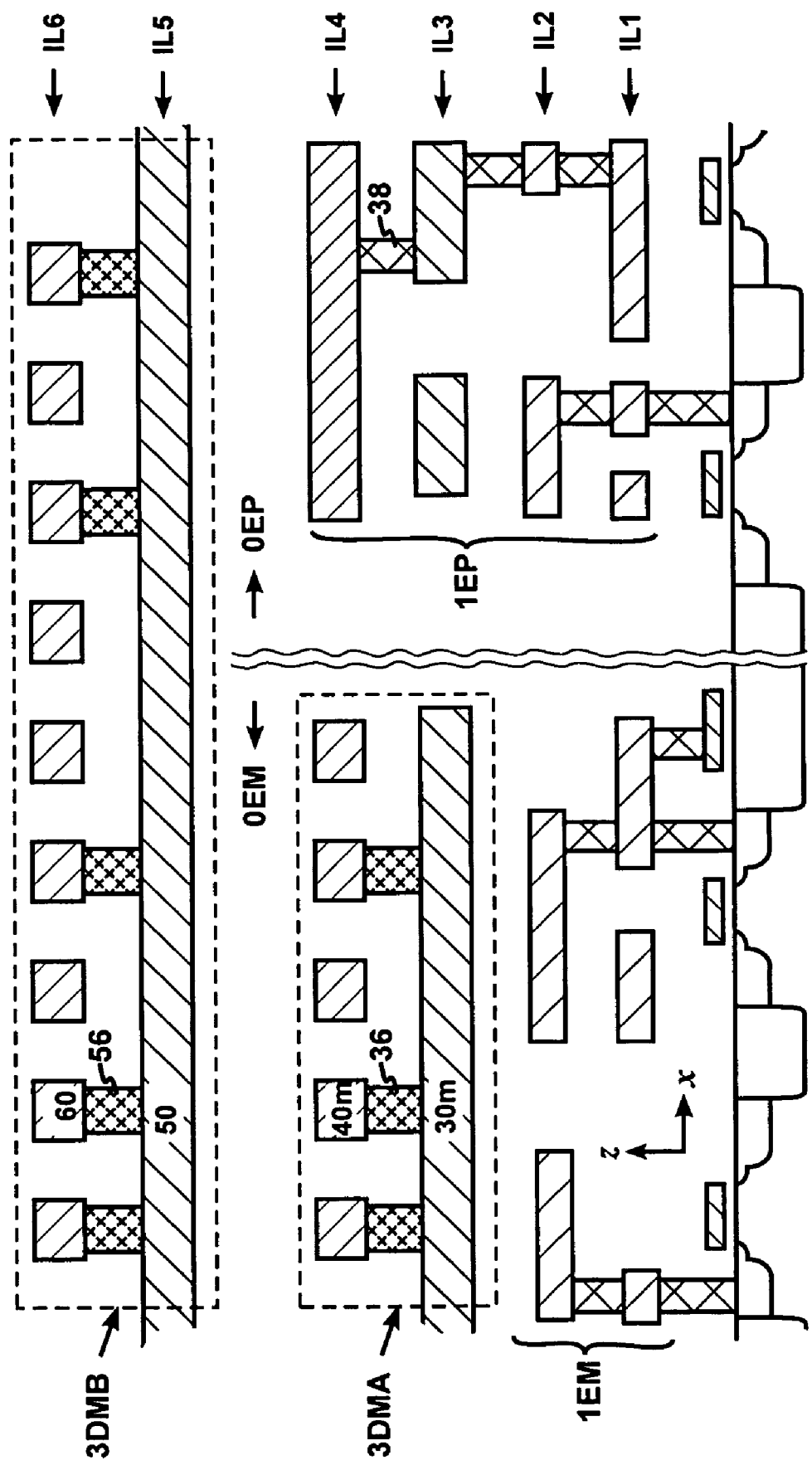
FIG. 15 illustrates a preferred 3DM-SoC with 3D-M covering both eM and eP regions.

FIG. 15 illustrates a preferred 3DM-SoC with 3D-M covering both eM and eP regions. In this preferred embodiment, besides the 3D-M in the un-used interconnect space 3DMA, there is an additional full 3D-M level 3DMB. Here, full 3D-M level refers to the 3D-M level that covers almost the whole chip, e.g. at least a portion of the eP region 0EP and at least a portion of the eM region 0EM. It also comprises a plurality of lower address-selection lines 50, upper address-selection lines 60 and 3D-M cells 56. It should be apparent to those skilled in the art that there might be more than two full 3D-M levels in a 3DM-SoC. With full 3D-M level(s), 3DM-SoC can have even larger storage capacity.

Finally, applications of the 3DM-SoC will be discussed. The 3D-M in the 3DM-SoC can be used to publish contents. For example, it can be used to store multimedia files (e.g. audio/video files for entertainment, map images for GPS, text/sound/images for dictionary and others . . . ) It can also be used to store test file to enable 3DM-SoC self-test. The possibilities are boundless. More details about the 3DM-SoC applications can be found in U.S. Pat. No. 6,717,222.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A system-on-a-chip integrated circuit, comprising:
   an embedded processor (eP) block and an embedded memory (eM) block;
   a three-dimensional memory (3D-M) block stacked on top of at least a portion of said eM block, said 3D-M block comprising at least one 3D-M level, said 3D-M level comprising a plurality of address-selection lines and 3D-M cells.

2. The system-on-a-chip integrated circuit according to claim 1, wherein said 3D-M is an electrically-programmable 3D-M (EP-3DM).

3. The system-on-a-chip integrated circuit according to claim 1, wherein said 3D-M is a non-electrically-programmable 3D-M (NEP-3DM).

4. The system-on-a-chip integrated circuit according to claim 1, wherein:
   at least a portion of said eM block uses fewer interconnect levels than said eP block;
   said 3D-M block is located on top of at least said portion of said eM block.

5. The system-on-a-chip integrated circuit according to claim 1, wherein:
   said eP block further comprises a first conductor and a second conductor;
   said 3D-M block further comprises a word line and a bit line; and
   said word line and said first conductor are at the same first interconnect level, said bit line and said second conductor are at the same second interconnect level.

6. The system-on-a-chip integrated circuit according to claim 1, further comprising at least one full 3D-M level covering at least a portion of said eP block.

7. The system-on-a-chip integrated circuit according to claim 1, wherein said 3D-M block comprises a plurality of 3D-M pillars, upper address-selection lines and lower address-selection lines, said 3D-M pillars being located between selected ones of said upper address-selection lines and said lower address-selection lines.

8. The system-on-a-chip integrated circuit according to claim 7, further comprising a half-via providing electrical conduction between selected ones of said upper address-selection lines and said 3D-M pillars.

9. The system-on-a-chip integrated circuit according to claim 7, wherein
   one dimension of said 3D-M pillar is equal to the width of said upper address-selection line; and
   the other dimension of said 3D-M pillar is equal to the width of said lower address-selection line.

10. The system-on-a-chip integrated circuit according to claim 1, wherein said 3D-M block comprises a plurality of 3D-M junctions, upper address-selection lines and lower address-selection lines, said 3D-M junctions being naturally formed at the intersection of selected ones of said upper address-selection lines and said lower address-selection lines.

* * * * *